US006114758A

United States Patent [19]

Anderson et al.

[11] Patent Number: 6,114,758

[45] Date of Patent: Sep. 5, 2000

[54] ARTICLE COMPRISING A SUPERCONDUCTING RF FILTER

[75] Inventors: Alfredo Carlos Anderson, Watertown, Mass.; Zhengxiang Ma, New Providence, N.J.; Paul Anthony Polakos, Marlboro, N.J.; Hui Wu, North Plainfield, N.J.

[73] Assignees: Lucent Technologies Inc., Murray Hill, N.J.; Massachusetts Inst. of Technology, Cambridge, Mass.

[21] Appl. No.: 09/138,102

[22] Filed: Aug. 21, 1998

[51] Int. Cl.[7] .......................... H01L 23/02; H01L 23/52; H01L 23/10

[52] U.S. Cl. .......................... 257/686; 257/685; 257/691; 257/707

[58] Field of Search .................................... 257/686, 685, 257/691, 707

[56] References Cited

PUBLICATIONS

Kolesov, S. et al., Extended Abstract, International Superconducting Electronics Conference, M63, pp. 272–274, Jun. 1997.

IEEE Transactions on Applied Superconductivity, vol. 7(2), Jun. 1997, pp. 2446–2453.

Ma, Zhengxiang et al., Extended Abstract, International Superconducting Electronics Conference, vol. 1, pp. 128–130, Jun. 1997, Berlin, Germany.

Bahl, I. et al., "Microwave Solid State Circuit Design", John Wiley and Sons, 1988, (especially Chapter 6).

Matthaei, G. et al., "Microwave Filters, Impedance Matching Networks and Coupling Structures", Artech House, Inc., 1980(especially Chapter 8).

*Primary Examiner*—David Hardy
*Assistant Examiner*—Jesse A. Fenty
*Attorney, Agent, or Firm*—Eugen E. Pacher

[57] ABSTRACT

The disclosed superconducting multipole RF filter comprises a multiplicity of coupled circular disk resonators designed for operation in the TM 010 mode. The disk resonators are arranged in a co-axial stack, with a circular metal spacer sandwiched between any two neighboring disk resonators. Each metal spacer has a central through-aperture, with a conductive member disposed in the through-aperture and electrically connecting the two neighboring disk resonators that are sandwiching a given metal spacer. A disk resonator comprises two circular members, each circular member comprising a circular dielectric substrate, exemplarily a $LaAlO_3$ wafer. Superconducting layers (typically YBCO) are disposed on each major surface of the substrate. The two members are joined together such that conductive layers (typically gold) electrically connect the two outside superconducting layers. The disclosed RF filter has good power handling capability, is compact, has good heat removal and relatively simple tuning. It can, for instance, be advantageously used as transmit filter in base stations of a wireless communication system.

9 Claims, 4 Drawing Sheets

ARTICLE COMPRISING A SUPERCONDUCTING RF FILTER

GOVERNMENT CONTRACT

This invention was made with Government support under contract No. MDA 972-96-3-0019 and contract Air Force DARPA F19628-95-C-0002. The Government has certain rights in this invention.

FIELD OF THE INVENTION

This application pertains to superconducting RF filters, and to articles (e.g., wireless communication systems) that comprise such a filter.

BACKGROUND

Superconducting RF resonators potentially can be combined into filters of very high performance at small volume, having, for instance, low insertion loss and sharp "skirts". However, it has been found that the power handling capacity of resonators that utilize a high temperature superconductor (HTS) material such as $YBa_2Cu_3$-oxide (conventionally referred to as "YBCO") frequently is limited, typically due to the presence of localized high current density in consequence of the Meissner effect. However, the advantage offered by use of a superconductor that does not have to be operated at liquid He temperature is so significant that there is a very strong incentive to improve the power handling capacity of resonators that use HTS material.

Recently a resonator geometry that can yield improved power handling capabilities was disclosed. The geometry is selected such that substantially no currents flow parallel to the edge of the HTS material. This is achieved with a disk resonator operating in the TM010 mode, wherein currents flow back and forth radially between the center and the edge of the disk. See S. Kolesov et al., Extended Abstract, International Superconducting Electronics Conference, MG3, pp. 272–274, June 1997, where a HTS TM010-mode disk resonator is disclosed, and Zhi-Yuan Shen et al., *IEEE Transactions on Applied Superconductivity*, Vol. 7(2), June 1997, pp. 2446–2453.

Generally two or more resonators are combined to provide a multipole filter. Kolesov et al., op. cit., disclose a 2-pole and a 4-pole filter, each comprising HTS TM010-mode resonators. The latter comprises two stacks of two disk resonators, with in-plane coupling elements providing the coupling between adjacent resonators (the second and third), and the cross coupling between the first and fourth resonators. A center hole is additionally used for the coupling between resonators.

Although the above discussed filters have relatively small size and light weight, and are said to be capable of handling up to 60 W of transmitted power, improvements would still be desirable. For instance, it would be desirable to have available a more compact filter design providing improved heat removal and relatively simple tuning. This application discloses such filters. The filters can, for instance, be used as transmit filters in base stations of a wireless communication system.

SUMMARY OF THE INVENTION

In a broad aspect the invention is embodied in an article (e.g., an RF filter, or a wireless communication system that comprises such a filter) that comprises a superconductive RF filter, typically a multipole filter. The frequency range of interest typically is 0.5–10 GHz.

More specifically, the invention typically is embodied in an article comprising a RF filter comprising a multiplicity of coupled circular disk resonators selected for operation in a resonator mode that has substantially no azimuthal current flow, and further comprising an input contact for providing a RF input current to the filter, and an output contact for receiving a RF output current from the filter;

Significantly, the disk resonators are arranged in a coaxial stack, with a circular metal spacer sandwiched between any two neighboring disk resonators. Any given said metal spacer has a central through-aperture, with a conductive member disposed in said through-aperture and electrically connecting said two neighboring disk resonators that are sandwiching said given metal spacer. The resonators of a given filter typically have the same geometry, but typically are dimensionally not identical.

In a currently preferred embodiment, a given one of the disk resonators comprises two circular members. A given one of the circular members comprises a circular dielectric substrate (exemplarily a $LaAlO_3$ wafer) having essentially parallel first and second major surfaces, and further having a circumferential surface. Superconducting material (e.g., YBCO) is disposed on the first and second major surfaces, and the circumferential surface is substantially free of superconducting material, such that no superconducting path connects the superconducting material on the first and second surfaces. The two circular members are joined together such that the respective first major surfaces are facing each other, and such that the superconducting materials on the respective second major surfaces are electrically connected.

Furthermore, in currently preferred embodiments the superconducting material disposed on the second major surface comprises a ring-shaped outer portion and a central circular patch that is separated from the outer portion by a circular trench that extends through the superconducting material to the substrate. The superconducting material disposed on the first major surface of the substrate comprises a circular layer having a diameter that is less than the diameter of the substrate, such that a ring-shaped portion of the first major surface is not covered by the superconducting material.

Disk resonators and metal spacers can readily be assembled into a coaxial stack to form a multipole filter that exemplarily can be advantageously used as a transmit filter in a wireless communication system. Although a filter according to claim 1 is not necessarily a superconducting filter, currently preferred filters utilize RTS material, typically YBCO, especially YBCO epitaxially grown on single crystal $LaAlO_3$. The filters are operated at a temperature below the critical temperature of the superconducting material, typically at 60° K. or below. Such operating temperatures can be readily maintained with, for instance, close cycle cryocoolers.

BRIEF DESCRIPTION OF THE DRAWINGS

The figures are not to scale or proportion. Similar features in different figures generally are designated by the same numeral.

DETAILED DESCRIPTION

Figure 1:
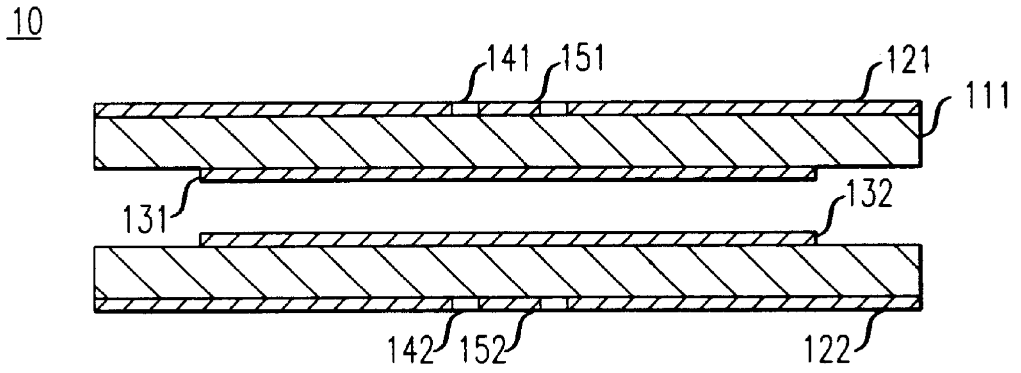
FIG. 1 schematically depicts an exemplary HTS TM010-mode disk resonator in exploded cross section view.

FIG. 1 schematically shows an exemplary HTS TM010-mode disk resonator 10 in exploded cross section view. The disk resonator comprises two circularly symmetric members. Each member comprises a dielectric substrate (e.g., 111), exemplarily a single crystal, two inch diameter, 0.5 mm thick $LaAlO_3$ wafer, and a HTS layer (exemplarily 0.5 $\mu$m thick YBCO) disposed on each major surface of the substrate. The inner HTS layers 131, 132 are patterned such that a ring-shaped outer portion of the substrate surface is not covered with HTS material. HTS layers 121, 122 on the other (second) major surface of the substrate are patterned to form ring-shaped trenches 141, 142 through the layer, with ring-shaped outer portion 121, 122 and central circular patches 151, 152 remaining. The outer HTS layers serve as ground planes. See Zhengxiang Ma et al., Extended Abstract, International Superconducting Electronics Conference, Vol. 1, pp. 128–130, June 1997, Berlin, Germany.

Figure 2:
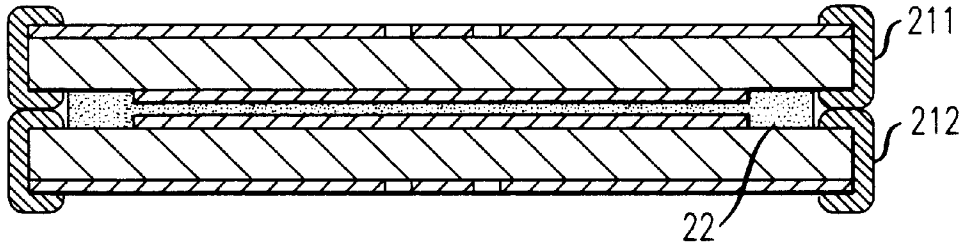
FIG. 2 schematically shows the members of FIG. 1 assembled into a double-sided disk resonator.

FIG. 2 schematically shows the members of FIG. 1 assembled into a double-sided disk resonator, with numerals 211 and 212 referring to relatively thick (e.g., 2–3 $\mu$m) conductor (e.g., gold) layers deposited on the circumferential surface of each substrate, the conductor material wrapping around the edge of the substrate to provide electrical connection between the two ground planes. We have found that electrically connecting the ground planes facilitates attainment of a high value of the quality factor Q. Numeral 22 of FIG. 2 refers to bonding material (e.g., thermal plastic such as PMMA, or epoxy) that holds the two members together. The bonding material can be applied and treated in conventional manner. We have observed that, at temperatures at or below 60° K., PMMA does not noticeably degrade the Q of the resonator.

Figure 3:
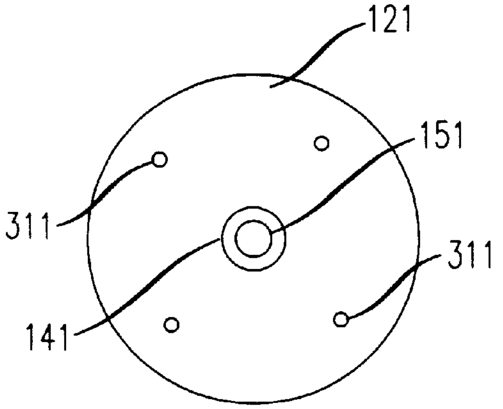
FIG. 3 schematically shows a ground plane of a disk resonator in plan view.

Once the two members of a disk resonator are bonded together, with an appropriate conductor connecting the ground planes on the edge, the frequency response of the resonator is essentially fixed (except for a frequency shift due to coupling in a multi-resonator filter, as will be known to those skilled in the art). Although the resonance frequency of a disk resonator as described is typically reproducible to within less than 1 MHz (e.g., 0.5 MHz), it is frequently necessary to provide tuning means that facilitate fine tuning of the resonance frequency. This can be achieved by etching small tuning holes through the HTS material of a ground plane. Exemplarily the tuning holes are positioned at a radial distance from the center that is substantially equal to the radius of the HTS layer on the first major surface. By provision of such tuning holes the capacitance of the resonator is reduced, resulting in an increase in the resonance frequency of the resonator. FIG. 3 schematically shows a ground plane of a disk resonator in plan view. Numeral 121 refers to the ring-shaped outer portion of the ground plane, numerals 311 refer to the tuning holes, and numerals 141 and 151 refer to the trench and the central circular patch, respectively.

Tuning of a disk resonator by means of a tuning hole or holes is substantially reversible. For instance, by covering up the tuning hole with normal (i. e., non-superconducting at the operating temperature) metal, the original resonance frequency can be substantially restored.

Frequency shifting of the filter response over a relatively wide frequency range can be obtained by the placement of a ferrimagnetic oxide (frequently referred to as "ferrite") in proximity to the HTS layer, together with means for providing a DC magnetic field bias to the ferrite. The ferrite can be used as the dielectric substrate, or possibly can be deposited as a thin or thick film by a known technique on the dielectric substrate. The magnetic field exemplarily is directed parallel to the substrate, and can be provided by a permanent magnet or an electromagnet.

In order to provide a multipole filter, two or more of the above-described resonators are assembled into a stack of coupled resonators.

Figure 4:
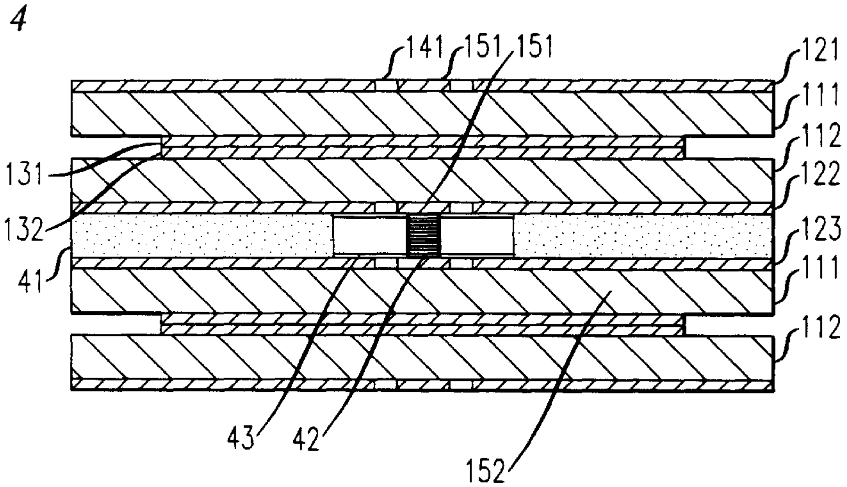
FIG. 4 schematically depicts two coupled disk resonators.

FIG. 4 schematically depicts two coupled disk resonators of the type shown in FIGS. 1 and 2. Numeral 41 designates a metal (e.g., Ti) spacer with a central through-aperture, and 42 designates an elastic conductive member that electrically connects HTS patches 151 and 152. Optional dielectric (e.g., $LaAlO_3$) ring 43 serves to hold elastic conductive member 42 in place. Exemplarily the member is a small bellows.

The metal spacer 41 inter alia provides tunability to the coupled disk resonators. Absent the metal spacer 41, with ground planes 122 and 123 in direct contact with each other, any tuning holes provided in one of the ground planes would be blocked by the other ground plane and thereby be rendered substantially inoperative. Provision of the metal spacer, with through-apertures corresponding to the tuning holes on the ground planes of the resonators, makes the coupled resonators tunable, substantially as described above. The thickness of the metal spacer advantageously is selected such that the effect of one ground plane on the tuning holes in the other ground plane is substantially negligible, typically in the range 0.2 mm to 2 mm. In an exemplary embodiment the metal spacer was a Ti disk of thickness 0.5 mm. For the sake of clarity, FIG. 4 shows neither tuning holes nor the corresponding holes through the metal spacer. Although spacer 41 could be any suitable normal metal, Ti spacers are preferred because of the good thermal match between Ti and $LaAlO_3$. Optionally the spacer is gold plated.

Central trench 141 and central circular patch 151 of the ground planes (e.g., 122 and 123), as well as the central through-aperture of the metal spacer 41 sandwiched between neighboring disk resonators facilitate coupling between the neighboring disk resonators. Absent the central circular patches, the presence of the metal spacer with central through-aperture would considerably weaken the coupling between the neighboring disk resonators, due to the low dielectric constant of air. This would typically not be a problem for narrow band filters (e.g., 1 MHz bandwidth at 2 GHz) which require only small coupling strength. However, for wider band filters (e.g., bandwidth >1 MHz at 2 GHz) the size of the coupling holes in the HTS layer of the ground planes could become impractically large. This problem is substantially overcome by provision of the central circular patches, with conductive member 42 electrically connecting the central circular patches 151 and 152, thereby effectively short-circuiting the air gap. Provision of the central circular patches and the conductive member 42 typically also results in improved manufacturability of the filter, due to decreased dependence of the filter characteristics on variations in air spacing.

The volume between conductive member 42 and the metal spacer advantageously is substantially filled with a dielectric ring 43, inter alia to secure in place member 42.

Figure 5:
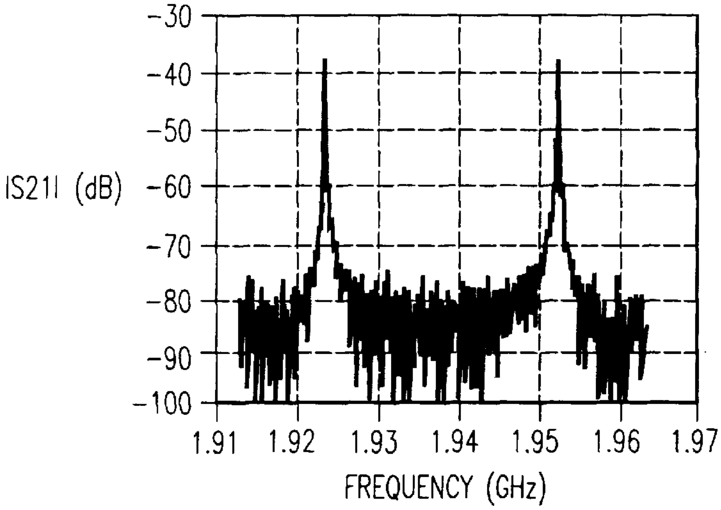
FIG. 5 shows the measured response of two coupled disk resonators.

FIG. 5 shows the measured response of two identical resonators coupled through a 4 mm diameter coupling hole in the ground plane. The ordinate shows the absolute value (in dB) of $S_{21}$, the transmission coefficient. The frequency difference between the two resonance peaks is a measure of the coupling strength between the two resonators.

Figure 6:
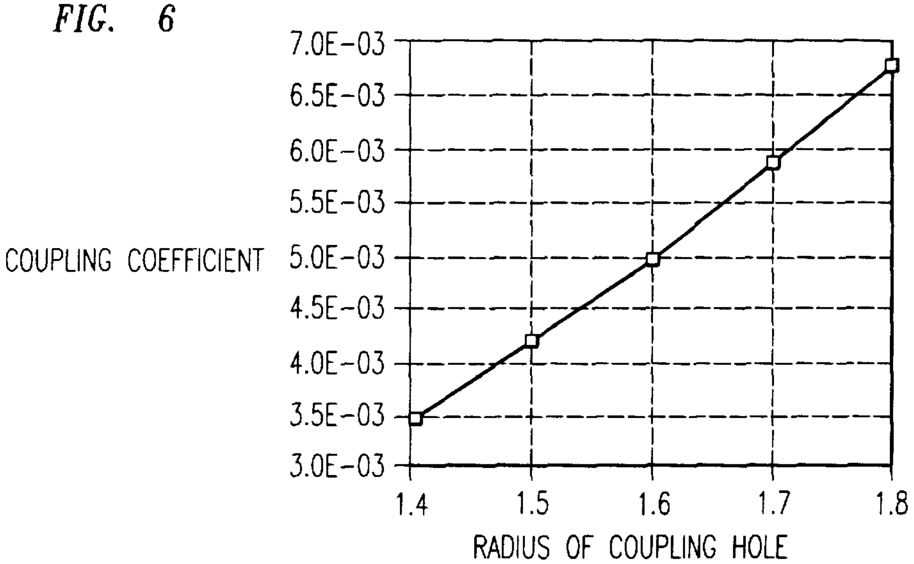
FIG. 6 shows computed values of the coupling coefficient of two coupled resonators.

FIG. 6 shows computed values of the coupling coefficient of two resonators as a function of the radius of the coupling hole, with the radius of the circular patch assumed to be 90% of that of the coupling hole. The "coupling hole" diameter corresponds to the outer diameter of trench 141 of FIG. 3.

Figure 7:
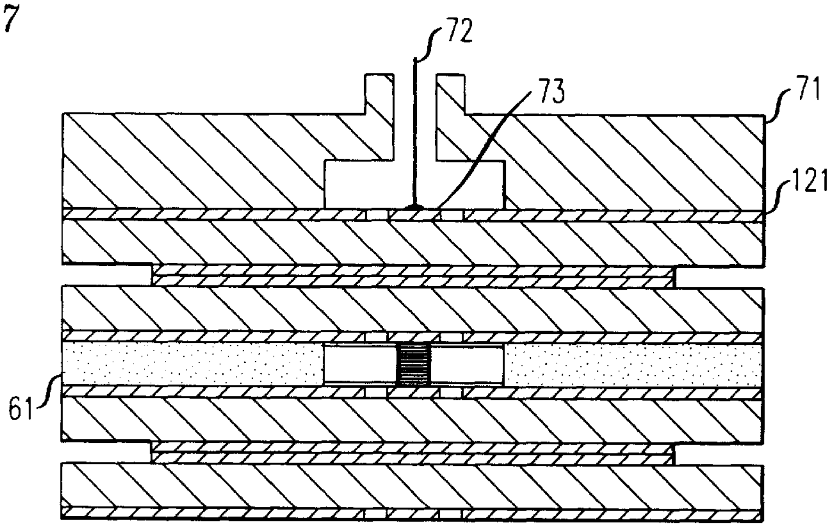
FIG. 7 schematically shows a relevant portion of a filter according to the invention.
Figure 11:
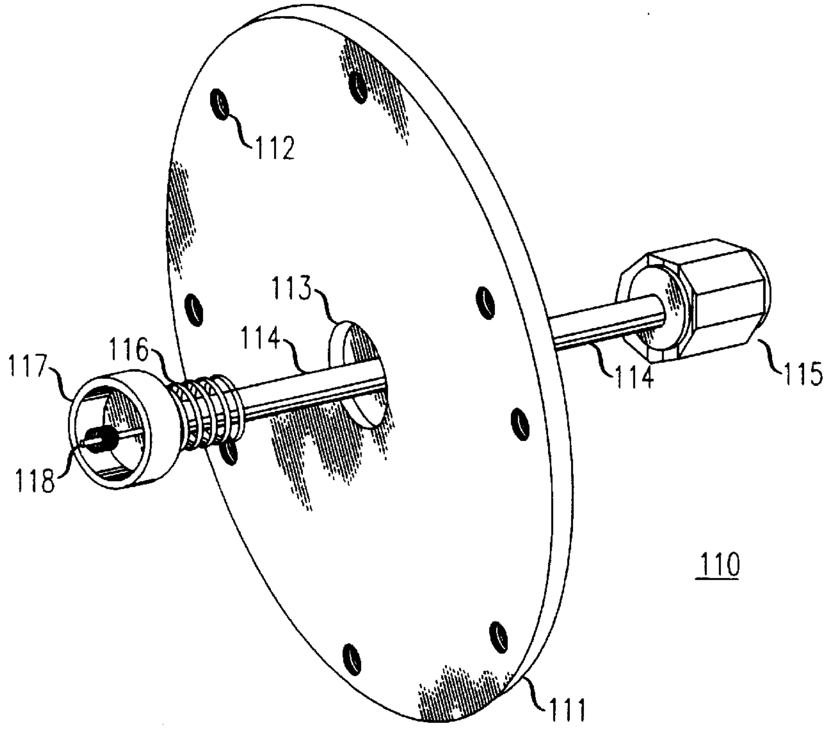
FIG. 11 schematically shows an exemplary top plate assembly of a filter according to the invention.

It will be understood that two or more coupled resonators, with metal spacer therebetween, are combined to form a multipole filter. Such a filter comprises means for coupling RF energy into the filter and out of the filter. FIG. 7 schematically shows one of these means. Metal fixture 71 is adapted for connection to the outer conductor of an appropriate coaxial cable or waveguide. Numeral 72 refers to the center conductor, conducively connected to central circular HTS patch 73 of ground plane 121. The electrical connection can be made in any convenient manner, e.g., by means of solder. Currently preferred is the use of elastic bellows (not shown) or other elastic member that urges the central conductor against the HTS patch. More detail is shown in FIG. 11.

Figure 8:
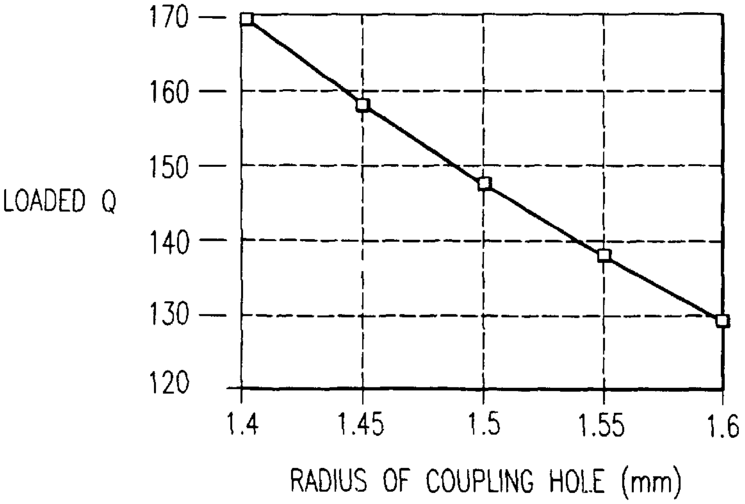
FIG. 8 shows computed values of the loaded Q of the first or last resonator of a multipole filter according to the invention.

The coupling fixture typically is designed in known manner to match the impedance of a coaxial cable or waveguide (typically 50 Ω) to the impedance of the filter. The size of the coupling hole and patch determines the coupling Q. FIG. 8 shows exemplary computed results for the loaded Q of the first or last resonator of a multipole filter as a function of coupling hole radius, with the patch radius being 90% of the coupling hole radius.

Figure 9:
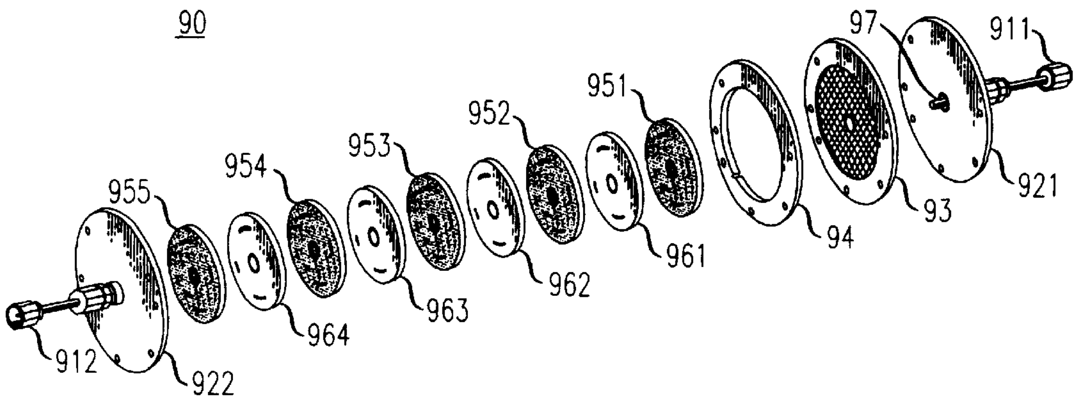
FIG. 9 schematically depicts, in exploded perspective view, an exemplary 5-pole filter according to the invention.

FIG. 9 schematically depicts, in exploded perspective view, an exemplary 5-pole filter 90 according to the invention. Numerals 951–955 refer to the 5 disk resonators, optionally one or more having appropriately dimensioned tuning holes. Between adjacent resonators is disposed a metal spacer 961–964, typically comprising a coupling hole and, optionally, non-central holes corresponding to tuning holes. Retainer ring 94 receives the resonators and spacers and maintains them axially aligned. Spring flange 93 is adapted to receive and hold springs (e.g., about 50 bellows or spiral springs) or other elastic members that serve to exert an axial force on the stacked components of the filter. Cover plates 921 and 922 are bolted together and complete the filter. Attached to the cover plates are connecting fixtures including coaxial connectors 911 and 912, with the center conductor of the connectors (e.g., 97) extending to the adjacent resonator (e.g., 951) and making contact with the HTSC patch thereof. See also FIG. 11.

Those skilled in the art will appreciate that typically the resonators of a multipole filter are not identical but may vary somewhat from resonator to resonator, exemplarily with respect to resonator diameter and/or the dimensions of the coupling structure. The variations are selected to yield the desired filter characteristics, e.g., Butterworth or Chebyshev. Procedures for determining the required variations are known. For background, see, for instance, "Microwave Solid State Circuit Design", I. Bahl et al., John Wiley and Sons, 1988, especially chapter 6, and "Microwave Filters, Impedance Matching Networks and Coupling Structures", G. Matthaei et al, Artech House, Inc., 1980, especially chapter 8.

Figure 10:
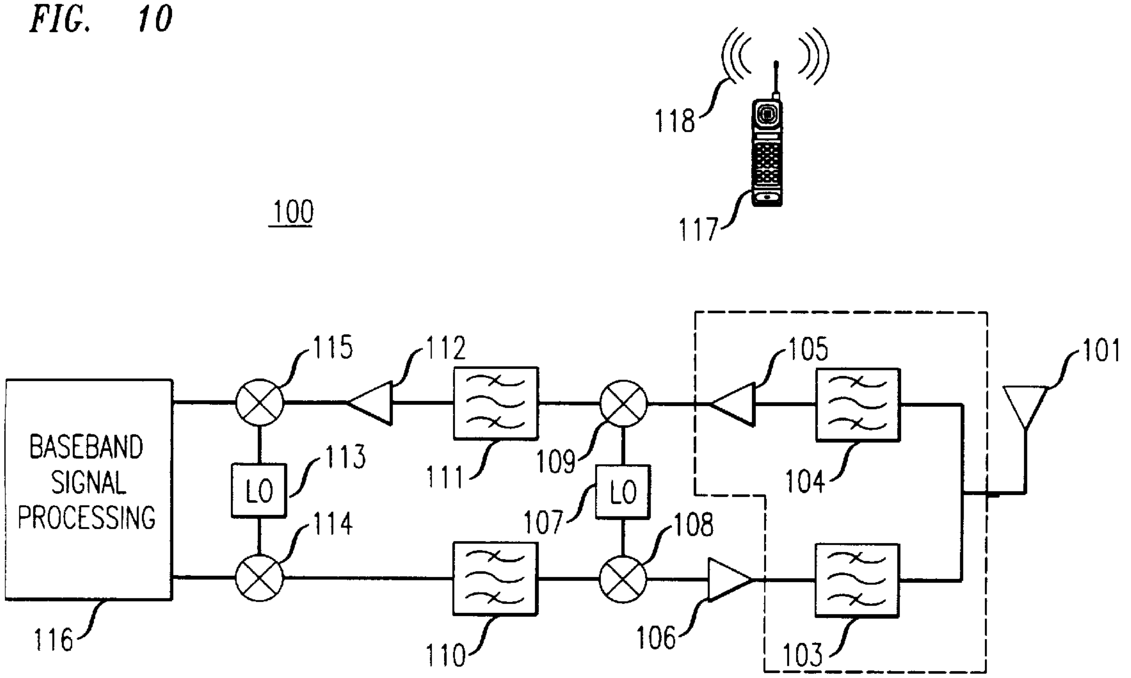
FIG. 10 schematically shows relevant aspects of a communication system that comprises a filter according to the invention.

FIG. 10 schematically shows relevant aspects of a communication system that comprises a filter according to the invention. Broken line 102 encloses the so-called "front end" of a base station, which comprises transmit filter 103, receive filter 104, and low noise amplifier 105. Antenna 101 receives a signal 118 from, e.g., mobile telephone 117, and also broadcasts a signal. The output of low noise amplifier 105 is mixed in mixer 109 with the signal from intermediate frequency local oscillator 107, and the mixer output is provided to channel selection filter 111. The filter output is provided to IF amplifier 112, the amplifier output is provided to mixer 115, together with the output of local oscillator 113. The mixer output is then fed to conventional baseband signal processing unit 116.

An output signal of baseband signal processing unit 116 is fed to mixer 114, wherein it is mixed with an output of local oscillator 113. The output of local oscillator 114 is filtered in conventional filter 110, with the filtered signal provided to mixer 108, wherein it is mixed in conventional fashion with an output of intermediate frequency local oscillator 107. The output of mixer 108 is provided to power amplifier 106, is filtered in transmit filter according to the invention 103, and fed to antenna 101.

It will be appreciated that system 100 can be conventional, with the exception of the transmit filter, which is a filter according to the invention, and with the exception of systems changes that are a consequence of the use of the transmit filter according to the invention, e.g., decreased channel spacing.

EXAMPLE

A 3-pole 15 MHz wide Chebyshev filter at 2 GHz is made as follows.

Three disk resonators and two spacers are provided. Each resonator consists of two wafers. The wafers are 0.5 mm thick, 2 inch (50.8 mm) diameter, commercially available $LaAlO_3$ single crystal circular wafers. Each wafer has 0.5 μm thick YBCO on both sides. The YBCO layers are deposited by a conventional technique, and patterned by a known technique that involves photolithography and ion milling.

From top of the stack to the bottom thereof, the YBCO layer geometries are as follows:

| | |
|---|---|
| Wafer 1, top surface: | circular trench, 3.664 mm outer diameter (OD), 2.9312 mm inner diameter (ID). |
| Wafer 1, bottom surface: | circular disk, 38.9356 mm diameter. |
| Wafer 2, top surface: | circular disk, 38.9356 mm diameter. |
| Wafer 2, bottom surface: | circular trench, 3.664 mm OD, 3.2976 mm ID. |
| Wafer 3, top surface: | circular trench, 3.664 mm OD, 3.2976 mm ID. |
| Wafer 3, bottom surface: | circular disk, 38.65734 mm diameter. |
| Wafer 4, top surface: | circular disk, 38.65734 mm diameter. |
| Wafer 4, bottom surface: | circular trench, 3.664 mm OD, 3.2976 mm ID. |

-continued

| | |
|---|---|
| Wafer 5, top surface: | circular ttench, 3.664 mm OD, 3.2976 mm ID. |
| Wafer 5, bottom surface: | circular disk, 38.9356 mm diameter. |
| Wafer 6, top surface: | circular disk, 38.9356 mm diameter. |
| Wafer 6, bottom surface: | circular trench, 3.664 mm OD, 2.9312 mm ID. |

On the circumferential surface of each wafer is deposited a 2–3 μm thick gold film that is wrapped around the edges and extends a short distance onto the planar major surfaces of the wafer. On each wafer, on the side that has the circular trench, is deposited a circular patch and a circular ring, both optional, and consisting of about 2–3 μm thick gold layer. The diameter of the patch is selected to be somewhat smaller than the ID of the trench, e.g., 2 mm, and the ID of the ring is somewhat larger than the OD of the trench. The OD of the ring exemplarily is 10 mm. The gold is deposited in conventional fashion, exemplarily by sputtering, and serves to improve electrical contact. Each pair of wafers is then bonded together with PMMA in conventional fashion such that the circumferential gold films of the two wafers of a pair are in electrical contact. This completes formation of the three disk resonators.

Two identical spacer plates are provided. Each comprises a 0.5 mm thick, 2 inch (50.8 mm) diameter gold plated titanium disk. Each disk has a 5 mm diameter hole in the center, and at radius 19.5 mm has four equally spaced 1 mm wide and 10 mm long circular through-slots. A single crystal $LaAlO_3$ bead is provided for each spacer plate. The bead is ring shaped, with 5 mm OD and 2 mm ID, of thickness 0.5 mm. The bead fits into the central hole of the spacer plate, and a bellows is fitted into the 2 mm central hole of the bead. In the assembled state of the filter, the bellows provide an axial force that serves to ensure good electrical contact between the respective elements of the filter. Suitable bellows are commercially available. Use of bellows is not mandatory, and other means for providing an axial force (e.g., small spiral springs) may be used, as will be evident to those skilled in the art.

The three disk resonators and two spacer plates will be assembled into a coaxial stack with alternating resonators and spacers, and the stack will be packaged. The package hardware comprises a base plate, a retainer ring, a protective back plate, a spring retainer plate and a top plate.

The base plate is a circular copper plate with threaded through-holes near the circumference of the plate, and with a countersunk hole in the center. A coaxial cable is fixed in the hole by soldering. The center conductor of the coaxial cable is fitted with a gold plated 2.5 mm diameter bellows of length such that the bellows extends slightly above the surface of the base plate.

The retainer ring is a 4 mm thick circular copper ring with ID slightly larger than 2 inches (50.8 mm), and with through holes corresponding to the threaded holes in the baseplate.

The (optional) protective back plate is a 50.8 mm diameter, 0.25 mm thick copper disk.

The spring retainer plate is a 3 mm thick circular plate, with 63 mm diameter, having an array (e.g., 100) of 2.5 mm diameter through-holes for receiving spiral springs (or other appropriate means for providing an axial force on the stack; e.g., bellows) in place. The spring retainer plate also has clearance holes corresponding to the threaded holes.

The top plate is similar to the bottom plate except that the holes that correspond to the threaded holes are clearance holes, and that the countersunk central hole is larger. A coaxial cable is inserted into the central hole in the top plate, with a bellows attached to the central conductor of the coaxial cable, and a brass cup attached to the outer conductor. The cup fits into the countersunk recess, with a spiral spring (or other appropriate elastic member) provided between the cup and the bottom of the recess.

FIG. 11 shows an exemplary top plate assembly 110. Top plate 111 comprises a multiplicity of clearance holes 112 and countersunk recess 113. Coaxial cable 114 passes through a central hole. A conventional RF connector is attached to the outside end of the coaxial cable, and a brass cup 117 is attached to the inside end, with electrical contact between the cup and the outer conductor of the coaxial cable. Spring 116 is disposed between the cup and the top plate. The cup is dimensioned to fit into the countersunk recess. A bellows 118 is attached to the center conductor of the coaxial cable, and serves to provide good electrical contact between the cable and the central circular patch of the top disk resonator. The base plate assembly can be similar to the top plate assembly, and does not require detailed description.

To facilitate assembly of the filter, the appropriate elements are provided with through holes for accommodating alignment pins. The disk resonators and the spacer plates are stacked on the bottom plate in appropriate order. The protective plate is placed on top of the stack, followed by the retainer ring and the spring retainer plate. Into the holes in the spring retainer plate are dropped 0.25 inch (6.33 mm) long springs, and the top plate is placed onto the spring retainer plate and secured by means of screws. The thus produced filter is tested and substantially meets design goals. It is compact, and facilitates efficient heat removal and tuning.

What is claimed is:

1. An article comprising a RF filter comprising a multiplicity of coupled circular disk resonators selected for operation in a resonator mode that has substantially no azimuthal current flow, and further comprising an input contact for providing a RF input current to the filter and an output contact for receiving a RF output current from the filter;

CHARACTERIZED IN THAT said disk resonators are arranged in a coaxial stack, with a circular metal spacer sandwiched between any two neighboring disk resonators, any given said metal spacer having a central through-aperture, with a conductive member disposed in said through-aperture and electrically connecting said two neighboring disk resonators that are sandwiching said given metal spacer.

2. Article according to claim 1, wherein a given one of said disk resonators comprises two circular members, a given one of said circular members comprising a circular dielectric substrate having superconductive material disposed on a first and a second major surface of said dielectric substrate, said dielectric substrate also having a circumferential surface substantially without superconductive material disposed thereon, said two circular members jointed together such that the respective first major surfaces are facing each other, and such that the superconducting materials on the respective second major surfaces are electrically connected.

3. Article according to claim 2, wherein the superconducting material disposed on the second major surface comprises a ring-shaped outer portion and a central circular patch that is separated from the ring-shaped outer portion by a circular trench extending through the superconducting material to the substrate, and wherein the superconducting material disposed on the first major surface comprises a circular layer having a diameter that is less than a diameter of said dielectric substrate, such that a ring-shaped portion of said first major surface is not covered by the superconducting material.

4. Article according to claim 3, wherein on the circumferential surface of the circular dielectric substrate is disposed a non-superconducting metal layer extending onto said first major surface without contacting the superconductive material on the first major surface, and extending onto said second major surface and contacting the ring-shaped outer portion of the superconducting material on the second major surface, such that the ring-shaped outer portions of the superconducting material on the respective second major surfaces of the two circular members of the given disk resonator are electrically connected.

5. Article according to claim 1, wherein said given metal spacer comprises titanium.

6. Article according to claim 2, wherein said superconductive material is $YBa_2Cu_3O_x$, where x is about 6.9.

7. Article according to claim 1, further comprising at least one elastic member selected to apply an axial force on the coaxial stack.

8. Article according to claim 2, wherein said circular dielectric substrate comprises a ferrimagnetic oxide, and wherein said article further comprises magnetic field generating means adapted for providing a DC magnetic field to said ferrimagnetic oxide.

9. Article according to claim 1, wherein the article is a communication system comprising a source of signals to be transmitted, a power amplifier connected to said source and having an amplifier output, a filter that receives said amplifier output and has a filter output, an antenna that receives said filter output and radiates electromagnetic radiation representative of the filter output, wherein said filter is a filter according to claim 1.

* * * * *